United States Patent
Thompson et al.

(10) Patent No.: US 8,877,619 B1
(45) Date of Patent: Nov. 4, 2014

(54) PROCESS FOR MANUFACTURE OF INTEGRATED CIRCUITS WITH DIFFERENT CHANNEL DOPING TRANSISTOR ARCHITECTURES AND DEVICES THEREFROM

(71) Applicant: SuVolta, Inc., Los Gatos, CA (US)

(72) Inventors: Scott E. Thompson, Gainesville, FL (US); Lucian Shifren, San Jose, CA (US); Pushkar Ranade, Los Gatos, CA (US); Lance Scudder, Sunnyvale, CA (US); Dalong Zhao, San Jose, CA (US); Teymur Bakhisher, San Jose, CA (US); Sameer Pradhan, San Jose, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 13/748,418

(22) Filed: Jan. 23, 2013

Related U.S. Application Data

(60) Provisional application No. 61/589,773, filed on Jan. 23, 2012.

(51) Int. Cl.
  *H01L 21/425* (2006.01)
  *H01L 21/336* (2006.01)
  *H01L 21/8234* (2006.01)

(52) U.S. Cl.
  CPC .............................. *H01L 21/823412* (2013.01)
  USPC ............................ 438/527; 438/308; 438/481

(58) Field of Classification Search
  USPC .................................................. 438/217, 227
  See application file for complete search history.

(56) References Cited

U.S. PATENT DOCUMENTS 3,958,266 A   5/1976 Athanas
4,000,504 A   12/1976 Berger (Continued)

FOREIGN PATENT DOCUMENTS

EP  0274278   7/1988
EP  0312237   4/1989

(Continued)

OTHER PUBLICATIONS

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, pp. 23-24, 1995.

(Continued)

*Primary Examiner* — Zandra Smith
*Assistant Examiner* — Pamela E Perkins
(74) *Attorney, Agent, or Firm* — Novak Druce Connolly Bove + Quigg LLP; Eduardo J. Quinones

(57) ABSTRACT

Structures and processes are provided that can be used for effectively integrating different transistor designs across a process platform. In particular, a bifurcated process is provided in which dopants and other processes for forming some transistor types may be performed prior to STI or other device isolation processes, and other devices may be formed thereafter. Thus, doping and other steps and their sequence with respect to the STI process can be selected to be STI-first or STI-last, depending on the device type to be manufactured, the range of device types that are manufactured on the same wafer or die, or the range of device types that are planned to be manufactured using the same or similar mask sets.

5 Claims, 10 Drawing Sheets

(56) References Cited

U.S. PATENT DOCUMENTS

| | | |
|---|---|---|
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |

(56) References Cited

U.S. PATENT DOCUMENTS

| | | | |
|---|---|---|---|
| 6,797,994 | B1 | 9/2004 | Hoke et al. |
| 6,808,004 | B2 | 10/2004 | Kamm et al. |
| 6,808,994 | B1 | 10/2004 | Wang |
| 6,813,750 | B2 | 11/2004 | Usami et al. |
| 6,821,825 | B2 | 11/2004 | Todd et al. |
| 6,821,852 | B2 | 11/2004 | Rhodes |
| 6,822,297 | B2 | 11/2004 | Nandakumar et al. |
| 6,831,292 | B2 | 12/2004 | Currie et al. |
| 6,835,639 | B2 | 12/2004 | Rotondaro et al. |
| 6,852,602 | B2 | 2/2005 | Kanzawa et al. |
| 6,852,603 | B2 | 2/2005 | Chakravarthi et al. |
| 6,881,641 | B2 | 4/2005 | Wieczorek et al. |
| 6,881,987 | B2 | 4/2005 | Sohn |
| 6,891,439 | B2 | 5/2005 | Jachne et al. |
| 6,893,947 | B2 | 5/2005 | Martinez et al. |
| 6,900,519 | B2 | 5/2005 | Cantell et al. |
| 6,901,564 | B2 | 5/2005 | Stine et al. |
| 6,916,698 | B2 | 7/2005 | Mocuta et al. |
| 6,917,237 | B1 | 7/2005 | Tschanz et al. |
| 6,927,463 | B2 | 8/2005 | Iwata et al. |
| 6,928,128 | B1 | 8/2005 | Sidiropoulos |
| 6,930,007 | B2 | 8/2005 | Bu et al. |
| 6,930,360 | B2 | 8/2005 | Yamauchi et al. |
| 6,957,163 | B2 | 10/2005 | Ando |
| 6,963,090 | B2 | 11/2005 | Passlack et al. |
| 6,995,397 | B2 | 2/2006 | Yamashita et al. |
| 7,002,214 | B1 | 2/2006 | Boyd et al. |
| 7,008,836 | B2 | 3/2006 | Algotsson et al. |
| 7,013,359 | B1 | 3/2006 | Li |
| 7,015,546 | B2 | 3/2006 | Herr et al. |
| 7,015,741 | B2 | 3/2006 | Tschanz et al. |
| 7,022,559 | B2 | 4/2006 | Barnak et al. |
| 7,036,098 | B2 | 4/2006 | Eleyan et al. |
| 7,038,258 | B2 | 5/2006 | Liu et al. |
| 7,039,881 | B2 | 5/2006 | Regan |
| 7,045,456 | B2 | 5/2006 | Murto et al. |
| 7,057,216 | B2 | 6/2006 | Ouyang et al. |
| 7,061,058 | B2 | 6/2006 | Chakravarthi et al. |
| 7,064,039 | B2 | 6/2006 | Liu |
| 7,064,399 | B2 | 6/2006 | Babcock et al. |
| 7,071,103 | B2 | 7/2006 | Chan et al. |
| 7,078,325 | B2 | 7/2006 | Curello et al. |
| 7,078,776 | B2 | 7/2006 | Nishinohara et al. |
| 7,089,513 | B2 | 8/2006 | Bard et al. |
| 7,089,515 | B2 | 8/2006 | Hanafi et al. |
| 7,091,093 | B1 | 8/2006 | Noda et al. |
| 7,105,399 | B1 | 9/2006 | Dakshina-Murthy et al. |
| 7,109,099 | B2 | 9/2006 | Tan et al. |
| 7,115,948 | B2 * | 10/2006 | Bhattacharyya ............... 257/347 |
| 7,119,381 | B2 | 10/2006 | Passlack |
| 7,122,411 | B2 | 10/2006 | Mouli |
| 7,127,687 | B1 | 10/2006 | Signore |
| 7,132,323 | B2 | 11/2006 | Haensch et al. |
| 7,169,675 | B2 | 1/2007 | Tan et al. |
| 7,170,120 | B2 | 1/2007 | Datta et al. |
| 7,176,137 | B2 | 2/2007 | Perng et al. |
| 7,186,598 | B2 | 3/2007 | Yamauchi et al. |
| 7,189,627 | B2 | 3/2007 | Wu et al. |
| 7,199,430 | B2 | 4/2007 | Babcock et al. |
| 7,202,517 | B2 | 4/2007 | Dixit et al. |
| 7,208,354 | B2 | 4/2007 | Bauer |
| 7,211,871 | B2 | 5/2007 | Cho |
| 7,221,021 | B2 | 5/2007 | Wu et al. |
| 7,223,646 | B2 | 5/2007 | Miyashita et al. |
| 7,226,833 | B2 | 6/2007 | White et al. |
| 7,226,843 | B2 | 6/2007 | Weber et al. |
| 7,230,680 | B2 | 6/2007 | Fujisawa et al. |
| 7,235,822 | B2 | 6/2007 | Li |
| 7,256,639 | B1 | 8/2007 | Koniaris et al. |
| 7,259,428 | B2 | 8/2007 | Inaba |
| 7,260,562 | B2 | 8/2007 | Czajkowski et al. |
| 7,294,877 | B2 | 11/2007 | Rueckes et al. |
| 7,297,994 | B2 | 11/2007 | Wieczorek et al. |
| 7,301,208 | B2 | 11/2007 | Handa et al. |
| 7,304,350 | B2 | 12/2007 | Misaki |
| 7,307,471 | B2 | 12/2007 | Gammie et al. |
| 7,312,500 | B2 | 12/2007 | Miyashita et al. |
| 7,323,754 | B2 | 1/2008 | Ema et al. |
| 7,332,439 | B2 | 2/2008 | Lindert et al. |
| 7,348,629 | B2 | 3/2008 | Chu et al. |
| 7,354,833 | B2 | 4/2008 | Liaw |
| 7,380,225 | B2 | 5/2008 | Joshi et al. |
| 7,398,497 | B2 | 7/2008 | Sato et al. |
| 7,402,207 | B1 | 7/2008 | Besser et al. |
| 7,402,872 | B2 | 7/2008 | Murthy et al. |
| 7,416,605 | B2 | 8/2008 | Zollner et al. |
| 7,427,788 | B2 | 9/2008 | Li et al. |
| 7,442,971 | B2 | 10/2008 | Wirbeleit et al. |
| 7,449,733 | B2 | 11/2008 | Inaba et al. |
| 7,462,908 | B2 | 12/2008 | Bol et al. |
| 7,469,164 | B2 | 12/2008 | Du-Nour |
| 7,470,593 | B2 | 12/2008 | Rouh et al. |
| 7,485,536 | B2 | 2/2009 | Jin et al. |
| 7,487,474 | B2 | 2/2009 | Ciplickas et al. |
| 7,491,988 | B2 | 2/2009 | Tolchinsky et al. |
| 7,494,861 | B2 | 2/2009 | Chu et al. |
| 7,496,862 | B2 | 2/2009 | Chang et al. |
| 7,496,867 | B2 | 2/2009 | Turner et al. |
| 7,498,637 | B2 | 3/2009 | Yamaoka et al. |
| 7,501,324 | B2 | 3/2009 | Babcock et al. |
| 7,503,020 | B2 | 3/2009 | Allen et al. |
| 7,507,999 | B2 | 3/2009 | Kusumoto et al. |
| 7,514,766 | B2 | 4/2009 | Yoshida |
| 7,521,323 | B2 | 4/2009 | Surdeanu et al. |
| 7,531,393 | B2 | 5/2009 | Doyle et al. |
| 7,531,836 | B2 | 5/2009 | Liu et al. |
| 7,538,364 | B2 | 5/2009 | Twynam |
| 7,538,412 | B2 | 5/2009 | Schulze et al. |
| 7,562,233 | B1 | 7/2009 | Sheng et al. |
| 7,564,105 | B2 | 7/2009 | Chi et al. |
| 7,566,600 | B2 | 7/2009 | Mouli |
| 7,569,456 | B2 | 8/2009 | Ko et al. |
| 7,586,322 | B1 | 9/2009 | Xu et al. |
| 7,592,241 | B2 | 9/2009 | Takao |
| 7,595,243 | B1 | 9/2009 | Bulucea et al. |
| 7,598,142 | B2 | 10/2009 | Ranade et al. |
| 7,605,041 | B2 | 10/2009 | Ema et al. |
| 7,605,060 | B2 | 10/2009 | Meunier-Beillard et al. |
| 7,605,429 | B2 | 10/2009 | Bernstein et al. |
| 7,608,496 | B2 | 10/2009 | Chu |
| 7,615,802 | B2 | 11/2009 | Elpelt et al. |
| 7,622,341 | B2 | 11/2009 | Chudzik et al. |
| 7,638,380 | B2 | 12/2009 | Pearce |
| 7,642,140 | B2 | 1/2010 | Bae et al. |
| 7,644,377 | B1 | 1/2010 | Saxe et al. |
| 7,645,665 | B2 | 1/2010 | Kubo et al. |
| 7,651,920 | B2 | 1/2010 | Siprak |
| 7,655,523 | B2 | 2/2010 | Babcock et al. |
| 7,673,273 | B2 | 3/2010 | Madurawe et al. |
| 7,675,126 | B2 | 3/2010 | Cho |
| 7,675,317 | B2 | 3/2010 | Perisetty |
| 7,678,638 | B2 | 3/2010 | Chu et al. |
| 7,681,628 | B2 | 3/2010 | Joshi et al. |
| 7,682,887 | B2 | 3/2010 | Dokumaci et al. |
| 7,683,442 | B1 | 3/2010 | Burr et al. |
| 7,696,000 | B2 | 4/2010 | Liu et al. |
| 7,704,822 | B2 | 4/2010 | Jeong |
| 7,704,844 | B2 | 4/2010 | Zhu et al. |
| 7,709,828 | B2 | 5/2010 | Braithwaite et al. |
| 7,723,750 | B2 | 5/2010 | Zhu et al. |
| 7,737,472 | B2 | 6/2010 | Kondo et al. |
| 7,741,138 | B2 | 6/2010 | Cho |
| 7,741,200 | B2 | 6/2010 | Cho et al. |
| 7,745,270 | B2 | 6/2010 | Shah et al. |
| 7,750,374 | B2 | 7/2010 | Capasso et al. |
| 7,750,381 | B2 | 7/2010 | Hokazono et al. |
| 7,750,405 | B2 | 7/2010 | Nowak |
| 7,750,682 | B2 | 7/2010 | Bernstein et al. |
| 7,755,144 | B2 | 7/2010 | Li et al. |
| 7,755,146 | B2 | 7/2010 | Helm et al. |
| 7,759,206 | B2 | 7/2010 | Luo et al. |
| 7,759,714 | B2 | 7/2010 | Itoh et al. |
| 7,761,820 | B2 | 7/2010 | Berger et al. |
| 7,795,677 | B2 | 9/2010 | Bangsaruntip et al. |

(56) References Cited

U.S. PATENT DOCUMENTS

| | | |
|---|---|---|
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 * | 4/2012 | Yang et al. .......... 438/286 |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |

(56) References Cited

U.S. PATENT DOCUMENTS

| | | | |
|---|---|---|---|
| 2011/0059588 A1 | 3/2011 | Kang | |
| 2011/0073961 A1 | 3/2011 | Dennard et al. | |
| 2011/0074498 A1 | 3/2011 | Thompson et al. | |
| 2011/0079860 A1 | 4/2011 | Verhulst | |
| 2011/0079861 A1* | 4/2011 | Shifren et al. | 257/402 |
| 2011/0095811 A1 | 4/2011 | Chi et al. | |
| 2011/0147828 A1 | 6/2011 | Murthy et al. | |
| 2011/0169082 A1 | 7/2011 | Zhu et al. | |
| 2011/0175170 A1 | 7/2011 | Wang et al. | |
| 2011/0180880 A1 | 7/2011 | Chudzik et al. | |
| 2011/0193164 A1 | 8/2011 | Zhu | |
| 2011/0212590 A1 | 9/2011 | Wu et al. | |
| 2011/0230039 A1 | 9/2011 | Mowry et al. | |
| 2011/0242921 A1 | 10/2011 | Tran et al. | |
| 2011/0248352 A1 | 10/2011 | Shifren | |
| 2011/0294278 A1 | 12/2011 | Eguchi et al. | |
| 2011/0309447 A1* | 12/2011 | Arghavani et al. | 257/368 |
| 2012/0021594 A1 | 1/2012 | Gurtej et al. | |
| 2012/0034745 A1 | 2/2012 | Colombeau et al. | |
| 2012/0056275 A1 | 3/2012 | Cai et al. | |
| 2012/0065920 A1 | 3/2012 | Nagumo et al. | |
| 2012/0108050 A1 | 5/2012 | Chen et al. | |
| 2012/0132998 A1 | 5/2012 | Kwon et al. | |
| 2012/0138953 A1 | 6/2012 | Cai et al. | |
| 2012/0146155 A1 | 6/2012 | Hoentschel et al. | |
| 2012/0167025 A1 | 6/2012 | Gillespie et al. | |
| 2012/0187491 A1 | 7/2012 | Zhu et al. | |
| 2012/0190177 A1 | 7/2012 | Kim et al. | |
| 2012/0223363 A1 | 9/2012 | Kronholz et al. | |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, p. et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

Banerjee, et al. "Compensating Non-Optical Effects using Electrically-Driven Optical Proximity Correction", Proc. of SPIE vol. 7275 7275OE, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 μm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

\* cited by examiner

PROCESS FOR MANUFACTURE OF INTEGRATED CIRCUITS WITH DIFFERENT CHANNEL DOPING TRANSISTOR ARCHITECTURES AND DEVICES THEREFROM

CROSS-REFERENCE TO RELATED APPLICATIONS

This non-provisional application claims the benefit of U.S. Provisional Application No. 61/589,773, entitled "FLEXIBLY ORDERED TRANSISTOR ISOLATION PROCESS COMPATIBLE WITH BOTH DDC AND DOPED CHANNEL TRANSISTOR MANUFACTURE" and filed Jan. 23, 2012, the contents of which are hereby incorporated by reference in their entirety.

FIELD OF THE INVENTION

The present technology relates to processes for manufacturing integrated circuits, and more specifically to processes for manufacturing integrated circuits with different channel doping transistor architectures and devices therefrom.

BACKGROUND

Modern integrated circuit (IC) die, such as a System on a Chip (SoC), may include millions of MOS transistors on the same die. These transistors are not necessarily identical in structure or use, but rather are divided into multiple blocks of transistor device types with different operational characteristics. Common transistors include analog/digital transistors, high/normal/low frequency transistors, transistors configured to mimic older transistor designs (i.e. legacy transistors), transistors designed to work at distinct voltages, and low/high power transistors, for which the transistors may be of planar MOS type and may be NMOS and PMOS. Alternative transistor designs may be DDC, FinFET or other designs. However, process flows that allow for multiple transistor device types on the same wafer or die are generally difficult to develop and can have relatively low yields. Further, such process flows tend to be extremely sensitive to changes in processes, equipment, and other manufacturing factors. Thus, manufacturers typically limit the types of transistors available on a single die and are resistant to altering manufacturing processes, equipment, or other factors. For this reason, manufacturers would prefer to implement transistors on a common process integration platform, for instance, all transistors being planar MOS type. Additionally, upgrading SoC designs to accommodate improved transistor designs, manufacturing equipment, or processes is generally not preferred due to the expense and risk of new circuit designs that are likely necessary. In view of the foregoing, designers of SoCs and other types of multi-transistor ICs often resort to reusing otherwise inferior or older transistor device types and processes in order to reduce costs and risks for the design and manufacturing of such ICs. The designer is forced to compromise performance and functionality for the sake of cost and manufacturability.

DETAILED DESCRIPTION

Figure 1:
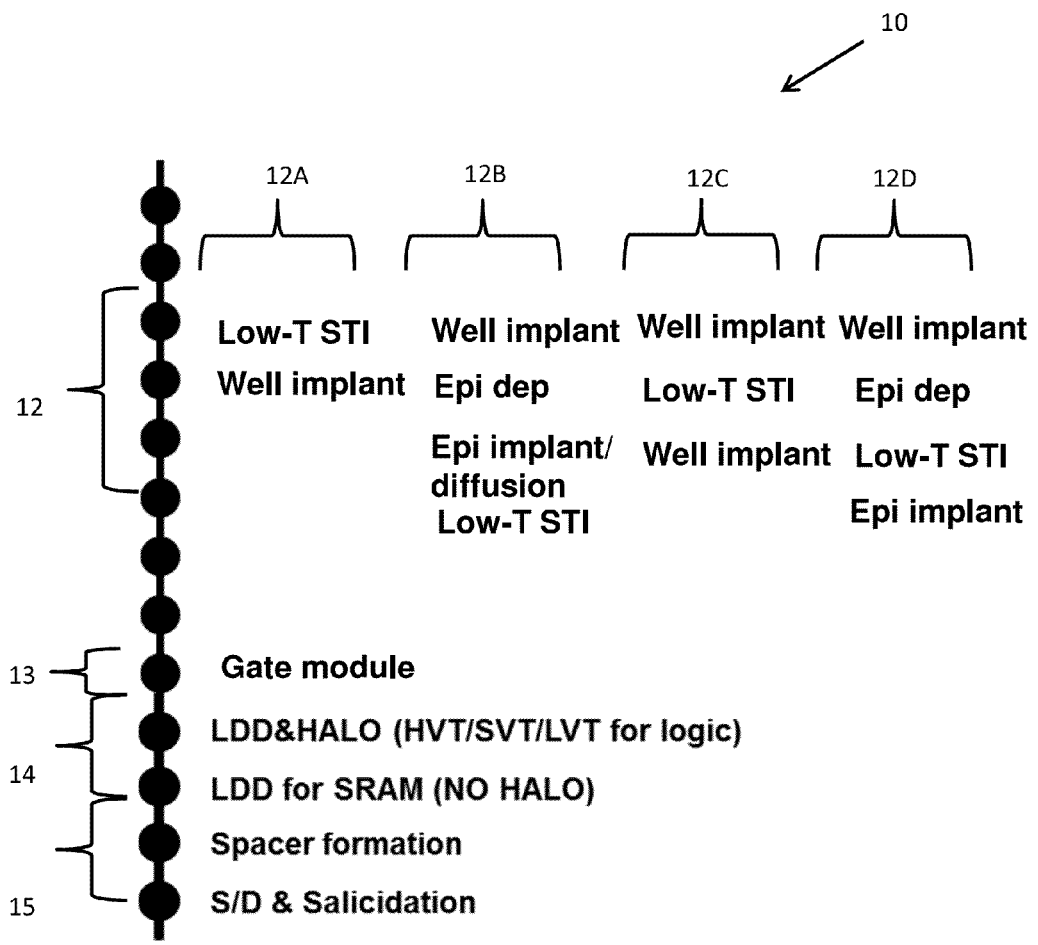
FIG. 1 is a schematic illustration of a processing scheme that can support manufacture of multiple transistor device types in accordance with the present technology.

The present technology is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. However, the present technology can be implemented without one or more of the specific details or with other methods. In other instances, well-known structures or operations are not shown in detail to avoid obscuring the invention. The present technology is not limited by the illustrated ordering of acts or events, as some acts may occur in different orders and/or concurrently with other acts or events. Furthermore, not all illustrated acts or events are required to implement a methodology in accordance with the present technology.

The challenge with advancing planar MOS transistors to support more modern SoC designs is the limitation of conventional MOS transistors' ability to continue to scale down voltage as transistor densities increase. A large process-related contributing factor to the scaling constraints is random dopant fluctuation in the transistor channel, thus limiting the ability to reduce threshold voltage of the device for reliable reduction in supply voltage. A solution for the random dopant fluctuation problem in the context of preferred CMOS process integration is to use deeply depleted channel (DDC) transistors.

For modern nanometer scale transistors, shallow trench isolation (STI) is typically used to provide device isolation. A typical STI process involves etching trenches with relatively steep sidewalls into the substrate on which the device will be built. The sidewalls are typically coated with liner layers, and the trench is thereafter filled with an electrically insulating dielectric. In a silicon-based process, the insulating fill dielectric is commonly a silicon oxide deposited by chemical vapor deposition. In most conventional process flows, STI is performed only once and early in a wafer processing flow, prior to the formation of the transistor channels. Such a process, commonly referred to as "STI-first" or "isolation first" process, is typically implemented using an optimized high-temperature process, followed by the creation of wells, channel doping, gate formation, and source and drain implants, optionally with halo and other implants, to set threshold voltage and control short channel effects. The STI process is typically performed at high temperatures (over 900 degrees Celsius, with 1000 degree Celsius plus temperatures being often used) that. In the case of a DDC transistor process, preferably, the STI is performed later in the wafer processing flow, that is, after the formation of the transistor channels where the wells are doped and then the screen and threshold voltage doping steps are performed, and then a blanket epitaxial silicon layer is deposited thereon. Preferably, the STI structures are formed using a relatively low temperature (LT) process after the blanket epitaxial silicon layer is formed. The LT STI process is selected to assure proper step coverage and quality of the STI without causing unwanted diffusion of the DDC dopant structures.

Exemplary STI-last or isolation-last structures and processes are more completely described in U.S. Pat. No. 8,273,617, entitled "Electronic Devices and Systems, and Methods for Making and Using the Same", U.S. patent application Ser. No. 12/971,884, entitled "Low Power Semiconductor Transistor Structure and Method of Fabrication Thereof", and U.S. patent application Ser. No. 12/971,955, entitled "Transistor with Threshold Voltage Set Notch and Method of Fabrication Thereof", all of which are herein incorporated by reference in their entirety.

In addition to STI, other process flows involving high temperature may be used. For instance, in DRAM processes, several high temperature steps may be used to integrate structures into the substrate, for instance, the trench capacitor. Typically, DRAM integrated circuits include periphery circuits that include digital logic. The periphery circuits may use STI, typically at an elevated temperature that otherwise is compatible with the DRAM cell process flow thermal budgets.

Some IC designers may prefer to integrate device types having different designs, to take advantage of the strengths of particular devices or to be able to reuse existing circuit designs in certain SoC areas and only redesign or port a circuit design in other SoC areas. For instance, IC designers may wish to use DDC transistors only in the SRAM blocks or only in the digital logic (or both) while using other transistors, for instance, conventional CMOS, FinFET or other transistors, on other SoC portions.

The present technology provides various structures and processes that can be used for effectively integrating different transistor designs across a process platform. In some embodiments, the present technology in effect uses "STI last" for some devices, for instance, DDC devices, and "STI first" for other devices, with all STI processes being kept at a reduced temperature. In other embodiments, the order of forming devices may be switched; that is, the non-DDC devices may be formed first at least through the high temperature process steps, then masked off, and then the DDC devices may be formed, in part or all the way through and including the gate and source and drain sequences. A bifurcated process is described in which dopants and other processes for forming some transistor types may be performed prior to STI or other device isolation process, and other devices may be formed thereafter. Effectively, this results in an IC in which some transistor types are manufactured from a STI-first process perspective and some from a STI-last process perspective, but without the need for separate STI processes. Thus, doping and other steps and their sequence with respect to the STI process can be selected to be STI-first or STI-last, depending on the device type to be manufactured, the range of device types that are manufactured on the same wafer or die, or the range of device types that are planned to be manufactured using the same or similar mask sets. Alternatively, the present technology includes a bifurcated process in which the high-temperature steps are performed first, for instance, high temperature STI or high temperature trench capacitor, then the DDC devices are formed at reduced temperature.

The present technology allows for low cost, high reliability manufacture of various device types and in particular, device types that are distinguished by threshold voltage of a transistor. For example, certain logic transistors may require a low threshold voltage (low Vt) for high speed switching, while other transistors on the same die may have a high threshold voltage that greatly reduces off-state leakage. A range of Vt values can be implemented using the present technology if it is desired to achieve a range of Vt values by combining DDC transistors with other transistor designs. Although the exemplary embodiments will be discussed herein primarily with respect to STI device isolation processes, it should be noted that the present technology is not limited in this regard. Rather, any other known or future device isolation processes can be used with the present technology. Additionally, although the context is provided as DDC transistors with conventional planar CMOS transistors, other combinations of transistor designs can be substituted within the scheme described herein with some transistors being fabricated from an "STI last" perspective and other transistors being fabricated from an "STI first" perspective on the same wafer. Further, an embodiment includes a hybrid, bifurcated process wherein the "STI first" or other such high temperature process, for instance, trench capacitors, are performed first, in portions of the wafer, and later, the DDC devices are fabricated in their wafer regions at a reduced temperature.

In some embodiments, a low temperature STI process can be used to limit the amount of dopant diffusion of any dopants introduced prior to the STI process, as noted above. Note that reference to a "low temperature" STI process refers to an STI process that is generally carried out at reduced temperatures compared with the standard, but how "low" the temperature is for low temperature STI is relative and not absolute and the particular temperature conditions selected for the STI are variable. In general, the temperature of a "low temperature" process will be selected based on the thermal cycle needs for the transistor channels fabricated prior to the STI process.

Although the preceding discussion is directed to the use of LT STI processes, the various embodiments are not limited in this regard. In other embodiments, a high temperature STI process, for instance, at temperatures of approximately 1200 degrees C. or more, can be used in some embodiments. In such embodiments, such STI processes are used in conjunction with adequate diffusion blocking steps in order to avoid unwanted migration of dopants formed prior to the STI process. For example, buffer layers or carbon or any other diffusion inhibiting species can be used to block migration of dopants to allow for an elevated temperature for the STI process. As a result, the amount of diffusion of dopants incorporated prior to performing STI can be limited by incorporating such diffusion inhibiting species, despite the high thermal budget of the high temperature STI process. Still further, a high temperature STI process may be used first, prior to formation of DDC structures which may be formed in their own selected regions in a subsequent step, while the high temperature regions are masked off.

As noted above, certain types of transistors benefit from a STI-last process, such as DDC and for that matter, slightly doped channel (SDC) transistors. In a typical process flow for such transistors, a well is formed and then the top of the well is further doped to form a heavily doped layer, i.e., a screening layer. Then, a threshold voltage (Vt) adjust layer may be incorporated. Then, a blanket epitaxial layer is deposited on the wafer, extending across multiple dies and transistor die blocks. The blanket epitaxial layer (blanket epi) forms a new surface for the wafer. Additional dopants can then be introduced to further adjust the Vt, for instance, to form SDC transistors or to form the doped channels for conventional transistors. In certain embodiments, the screening layers, Vt adjust layers, or other transistor structures can be formed with minimal implant energies to reduce scattering, and with precision because of the lack of STI structures to otherwise set up for proximity effects. Note that a dopant diffusion inhibitor such as a carbon buffer layer can be added to limit dopant migration. Such devices benefit from an STI-last process for many reasons, for instance, by using STI-last, blanket epitaxial deposition can be used to achieve a uniform channel thickness particularly in those areas of DDC and SDC doped regions where the depth of the doped screen and Vt adjust layers affect the Vt set.

Although the present technology will be described primarily with respect to STI-last processes for DDC and SDC transistors, it is noted that other types of devices can be manufactured using the present technology. For example, certain FinFET devices can be integrated with the present technology, such as those described in International Application No. PCT/US12/49531, entitled "Semiconductor Devices Having Fin Structures and Fabrication Methods Thereof" and which is herein incorporated by reference in its entirety.

Optionally, in some embodiments, during the remainder of wafer processing, various device temperature dependent dopant profiles resulting from global or selective (e.g. masked rapid thermal annealing) can be formed at least in part from differential out-diffusion of the screen layer into the epitaxial channel layer. This provides distinct transistor devices with different channel thickness and dopant concentration.

In some embodiments, halo implants, channel implants or other suitable techniques can be used to dope the channel as required to form conventional, doped channel transistors. For practical reasons, a designer may opt for using conventional transistors for portions of the SoC so that the pre-existing circuit-designs can be reused with no to minimal conversion of the circuit-designs for the new semiconductor process. Inefficient and unreliable doped channel transistors that have been designed in can be used in conjunction with DDC or SDC transistors used in other blocks. The doped channel transistors can be updated and modified later to incorporate power efficient DDC type transistors.

FIG. 1 is a schematic illustrating certain features of representative process 10 capable of forming a basis for manufacture of transistors with or without a doped channel. Device types that can be manufactured by the illustrated process can include, but are not limited to, doped or undoped DDC transistors, SDC transistors, conventional bulk planar CMOS transistors, or other transistors such as FinFET. Applications for such varied transistors include digital or analog, high or low power, or high or low speed, achieved by high, low, or regular or no threshold voltage set. The transistors may be statically or dynamically body biased and/or be used for specialty applications such as power management, high speed signal transfer, latches, clocks, oscillators, SRAM, capacitor coupled DRAM, or combinations of the foregoing or other applications. Device types are primarily distinguished by threshold voltage, but each device type has its own mobility, transconductance, linearity, noise, power, application (e.g. signal processing or data storage), leakage or any other characteristic of interest. Since modern SoCs or other complex electronic die may require dozens of different device types for operation, structures that can be readily modified to form various transistor devices using an easily integrated process are advantageous for yield and reliability and cost.

Process 10 includes performing various pre-gate processes 12, including various combinations of implants, blanket epi formation, and STI formation and sequences. Thereafter, a gate module 13 can be performed, followed by post-gate implants 14, e.g., halo (as needed) and LDD implants. Finally, additional processes 15 can be performed, such as space formation, source/drain implants, and salicidation and other metallization processes.

As generally shown in FIG. 1 by variations of 12 at 12A-12D, certain steps of process 10 can be optional, reordered, modified, or omitted entirely to form the various types of transistors. For example, 12A represents a pre-gate process for limited to a low temperature (LT) STI formation process (LT STI process) followed by well implants, to form standard transistors. 12B represents a pre-gate process consisting of well implants, followed by blanket epi formation (optionally with blanket epi dopant implants or diffusions, followed by a LT STI process for forming DDC or SDC transistors. 12C represents a pre-gate process including first well implants, followed by a LT STI process, and subsequently second well implants. Finally, 12D represents pre-gate process including well implants followed by blanket epi formation. Thereafter a LT STI process is performed, followed by blanket epi implants. As illustrated above, the pre-gate processes can be configured such that transistors can be formed with or without an epitaxial layer capable of forming at least a portion of the channel. If an epitaxial layer is grown, it can be processed so that all or part of the epitaxial layer is undoped or slightly doped, as further discussed below. These representative pre-gate processes are presented only for illustrative purposes. In the various embodiments, any other pre-gate processes can be used.

Moreover, the process 10 shows that other processes (at 13, 14, and 15) can also include steps that are optional, reordered, modified or omitted as well. For example, the gate module 13 allows for polysilicon gate, metal gates, or any other type of gate structures to be formed. Post-gate implants 14 allows for using halo implants, additional threshold voltage setting implants, logic/memory implants, or any other types of implants, depending on device types for the IC.

Additionally, a combination of options can be used at 12, 13, 14, and 15. For example, SRAM devices can be formed by an initial well implant, followed by epitaxial layer deposition, and dopant diffusion into part of the epitaxial layer, with shallow trench isolation then being performed as part of an STI-last process module. After gate oxidation, lightly doped drains (LDD) can be formed, but care is taken to minimize dopant migration into the epitaxial channel by omitting halo implants, threshold voltage implants, or other processing techniques that could promote or allow dopant contamination of the channel. In contrast, a high threshold voltage transistor with a doped channel can require halo implants after an initial low temperature STI and well implant processing (bracket 12A). As will be appreciated, other process module combinations suggested by the Figures and disclosed herein are also available to manufacture a broad range of device types.

Although some embodiments rely on the lowering of the processing temperatures for STI formation, in other embodiments, the LT STI process can be combined with other low temperature processes to further lower the thermal budget. Thus, in some embodiments, manufacture of certain known transistor types or future transistor types for which STI-last processes are preferred but that require even lower thermal budgets can be provided by an overall lowering of the thermal budget. This is discussed in further detail with respect to FIG. 2.

Figure 2:
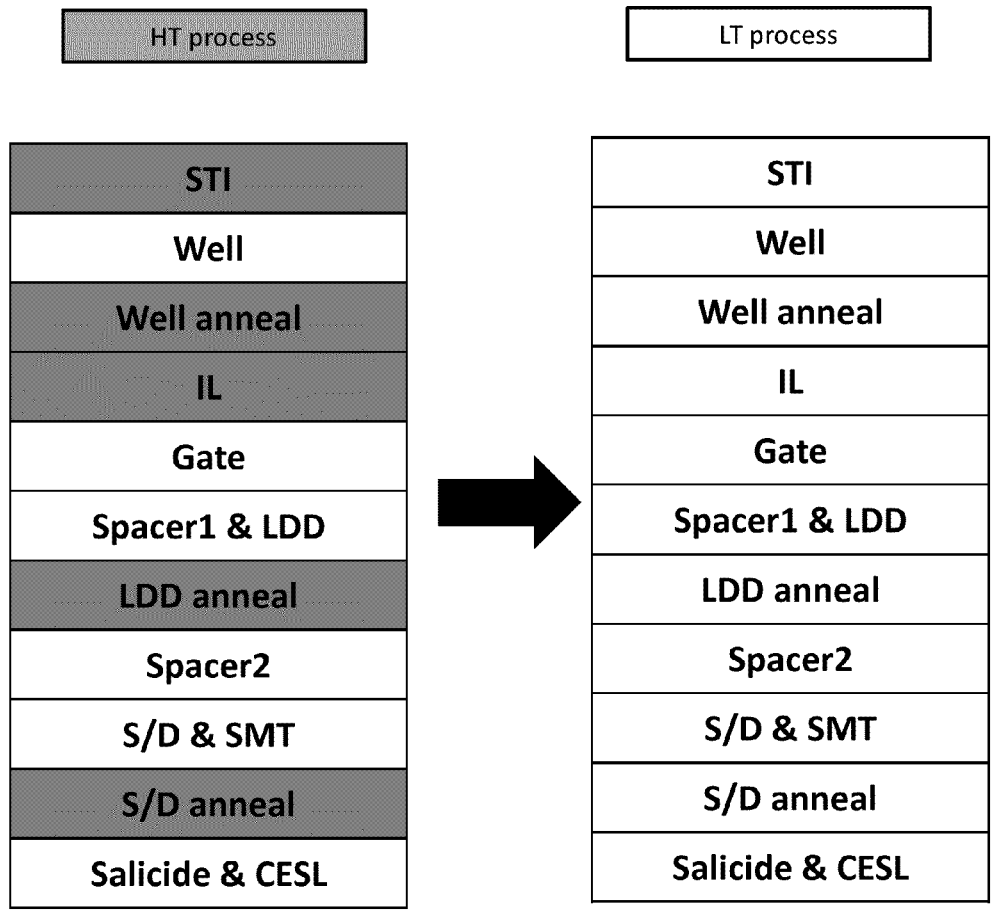
FIG. 2 is a schematic illustration comparing and contrasting a conventional processing scheme and an improved low temperature processing scheme that can support manufacture of multiple transistor device types in accordance with the present technology.

FIG. 2 is a schematic illustration comparing and contrasting a conventional, high temperature (HT) processing flow 20 and an improved low temperature processing flow 22 that can support manufacture of multiple transistor device types in accordance with the present technology. In processing flow 20 the high thermal budget steps (>900 degrees Celsius) are identified by shading in FIG. 2. These include the steps for STI, well implant anneal, Insulator Liner, LDD implant anneal, and S/D implant. Well implants, gate formation, first spacer formation, LDD implants, second space formation, source/drain implants, stress memorization technology (SMT), salicide formation, and contact etching stop layer (CESL) formation are typically performed using low thermal budget processes.

In process flow 22, instead of using high temperature processing, low temperature processing of preferably less than 900 degrees Celsius can be used for STI and as well for any of the well anneals, LDD anneals, S/D anneals, and gate/gate oxide (Gox) processing, or any of the other HT steps from process flow 20. In the various embodiments, the temperature can be higher than 900 degrees Celsius, yet still provide low temperature processing. As noted above, for the process to be considered "low temperature", the temperature of the anneals is reduced by comparison to avoid migration of dopants—the "low temperature" can be higher with incorporation of migration stop layers, for instance, or by the selection of dopants that are not so diffusing, or both. Accordingly, as used herein with respect to a process, the terms "low temperature" or "LT" shall refer to a process performed at a temperature that provides little or no migration of at least one dopant species introduced prior to the STI process.

Typically, bulk wafer processing temperatures in a LT process flow are maintained between 600 and 950 degrees Celsius, with temperatures below 900 degrees Celsius being preferred, though temperatures as high as 1100 degrees Celsius can be tolerated at reduced anneal time. Put another way, since the major concern regarding increased thermal budgets is the diffusion of species, LT processes can encompass higher temperature processes (>900 degrees Celsius) but performed over short periods of time. For example, rapid thermal annealing (RTA) using laser, flash lamps or other rapid heating processes can transiently raise surface temperature of the wafer on a millisecond to multiple second time scale. However, RTA temperatures up to 1000 degrees Celsius (with less than 950 degrees Celsius preferred), laser heating temperatures up to 1300 degrees Celsius, and spike temperatures up to 1100 (with less than 1060 degrees Celsius preferred) are acceptable for short times, as long as bulk wafer temperatures remains below 950 degrees Celsius. However, even if transient high temperature annealing schemes such as RTA or laser annealing are used for certain process steps, use of a true low wafer bulk temperature processing scheme is preferred to reduce dopant migration or diffusion and help ensure desired dopant profiles are maintained.

The following Table 1 illustrates some example temperature ranges and processing conditions used to manufacture a representative DDC device as part of a LT process flow. As will be understood, in the following Table 1, specific process steps, temperatures, and times can be adjusted to suit available tooling, device types, and process nodes. Generally, as device size decreases, the temperatures and times used to process wafers will also decrease.

TABLE 1

Exemplary LT Process Conditions for Manufacturing DDC Devices

| Process Step | Thickness | | Process Conditions (temp/time) |
|---|---|---|---|
| Pad Oxide | 1.5-10 nm | ISSG | 800-820 C. 5-60 sec |
| Pad Nitride | 5-150 nm | Furnace | <900 C. |
| STI Etch | | Chemical Etch | |
| Liner Oxide | 1-5 nm | ISSG | 800-820 C. 5-50 sec |
| Gap-Fill Densification (Either HDP or HARP or hybrid can be used) | | HDP HARP | None 700-800 C., 30-200 min or 800-850 C. <60 sec |
| GOX1, GOX2 | | ISSG | 850-900 C. 10-40 sec |
| | | Furnace | 725-775 C. 5-60 min |
| GOX3 | | ISSG | 850-900 C. 5-30 sec |
| Gate nitridation | | DPN | <700 C. |
| Gate Anneal (post nitridation anneal) | | PNA | 800-900 C. |

The process conditions listed above are provided for illustrative purposes only. In the various embodiments, other process conditions can be specified to provide LT processes.

In the case of adoption of a LT STI process, alone or in combination with any other low temperature processes, the actual order of the doping steps with respect to the STI process can vary depending on the device types to be manufactured on the same wafer or die or the device types that are planned to be manufactured using the same or similar process conditions. However, the various embodiments do not require the implementation of DDC or SDC devices or for that matter, performing any steps prior to the LT STI process. Rather, in some embodiments, manufacturers can adopt a LT process for IC designs irrespective of whether the LT process is used for DDC or SDC. For instance, a semiconductor manufacturer may elect to implement a LT process and sometime thereafter, incorporate DDC or SDC transistors therein. Preferably, the LT process is used to secure the dopant profiles desired for the transistor channels. Certain transistor channels can be formed before STI; other transistor channels can be formed after STI. A blanket epitaxial layer facilitates the finalization of the channel formation or serves as a substrate for channels after epitaxial formation. STI is formed after blanket epitaxial growth but, for those transistor channels formed post STI, such transistor channels in effect use an "STI first" process. In the case of incorporating DDC devices, the process flow adds masking steps for performing pre-STI implants, including screening layer implants and Vt adjust implants, and then forming of blanket epi. Thereafter, the STI and other previously existing steps can be performed without significantly affecting the performance of the DDC device. In this way, a SoC design can be updated to be formed entirely or in part of DDC transistors.

Figure 3:
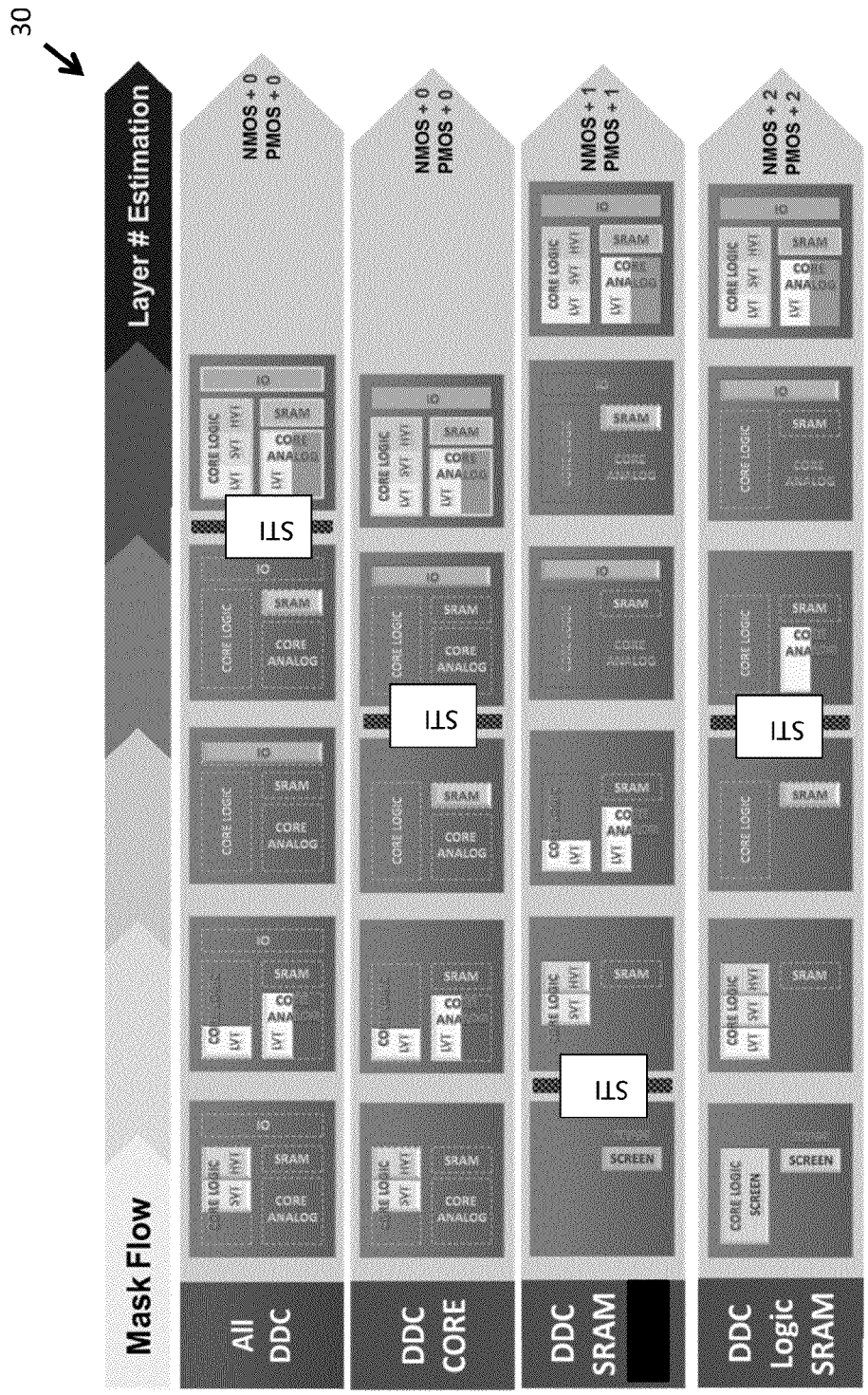
FIG. 3 is a schematic illustration of exemplary mask layouts for multiple transistor device types, including solely DDC transistor device types, or solely doped channel transistor device types, or combinations of DDC and doped channel transistors.

To illustrate the variety of devices easily manufactured via low temperature processing and a flexible positioning of well implants and STI isolation in the overall process timing, FIG. 3 is provided. FIG. 3 is a schematic illustrating a mask flow and layout 30 for SoC dies accommodating various transistor types and corresponding STI timing. The dies resulting from such mask flows can include, but are not limited to, die having only DDC transistor device types, or alternatively, transistor device types (including doped channel transistors) in several different combinations with DDC. In FIG. 3, a masking position of a screen implant is generally indicated, while position of PMOS and NMOS, DDC or non-DDC transistor blocks of HVt or SVt core logic, SRAM, and analog are shown. Combinable transistor devices include other types of planar devices including legacy doped-channel devices, as well as modern three-dimensional gate devices including FinFET transistors that are built upwards from a pre-formed channel as a substrate.

Figure 4:
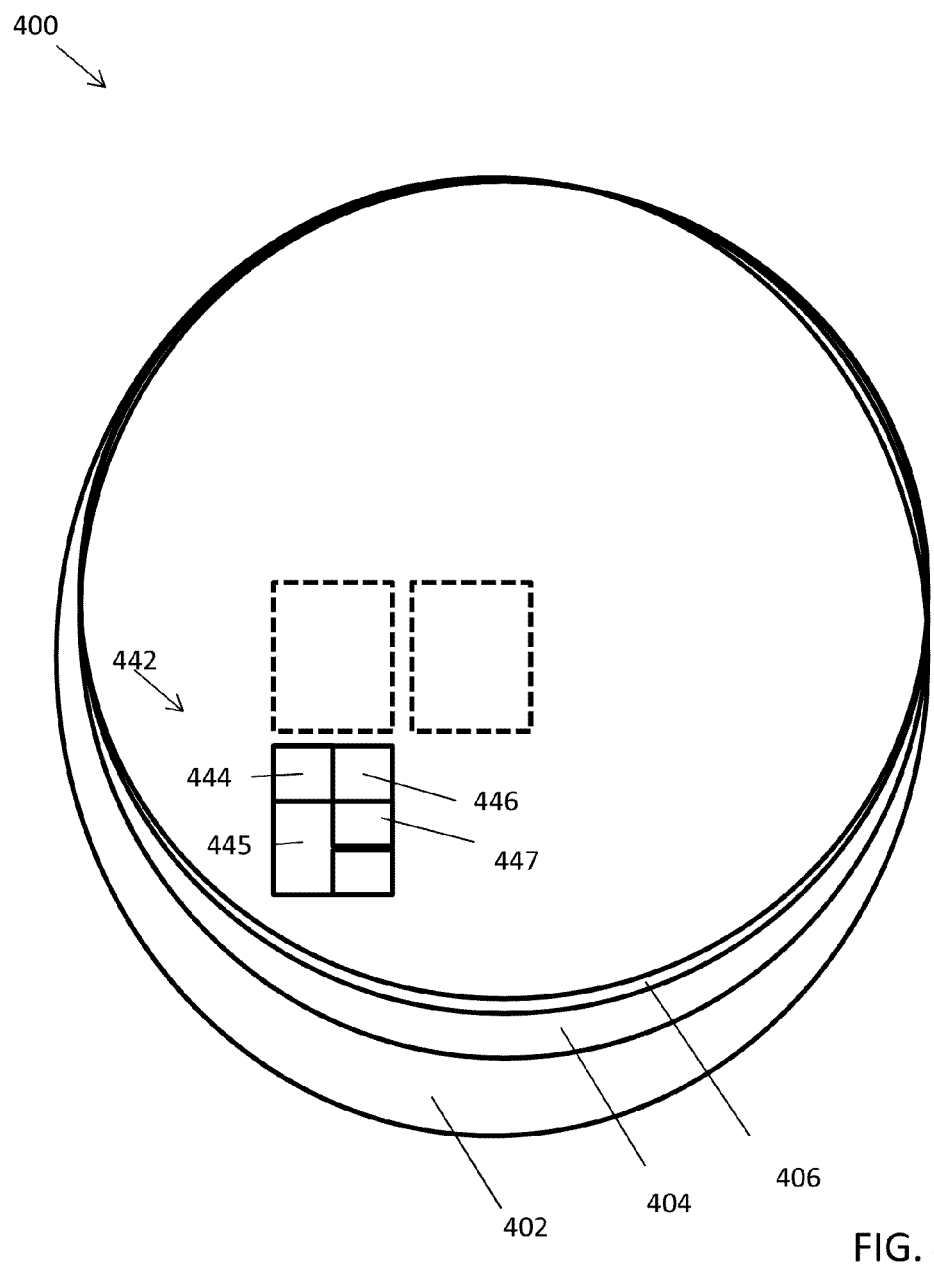
FIG. 4 illustrates representative and distinct transistor device types that can be supported on the wafer and die.

As another example of transistor manufacture on a wafer supporting multiple die, FIG. 4 shows semiconductor wafer 400 having a semiconducting surface supporting multiple die 442 with multiple device combinations. As previously discussed, each die can support multiple transistor device types, and the device types can be manufactured alone or in combination with each other, permitting the creation of a complex system on a chip (SoC) or similar die that optionally include analog, digital, legacy or improved transistors such as described in this disclosure. For example, four useful device blocks in a single die are illustrated as follows: block 444 outlines a collection of deeply depleted channel (DDC) transistors; block 445 outlines slightly depleted channel (SDC) transistors with some channel doping which can be achieved either by separate channel implant or by way of a controlled out-diffusion of previously-implanted dopants; block 446 outlines conventional channel doped transistors; and block 447 outlines undoped channel analog transistors. As will be appreciated, these transistor types are representative and not intended to limit the type of transistor device types that can be usefully formed on a die or wafer. The wafer 400 includes a substrate 402 (typically silicon), a lightly p-doped silicon layer 404 that can be secondarily implanted with optional anti-punchthrough (APT) layer (not shown), a screening layer, and an epitaxial blanket layer 406 of silicon, silicon germanium, or other suitable channel material grown after implantation of dopants in layer 406. For purposes of facilitating the description of the embodiments relating to the flexible low-temperature STI process herein, when multiple devices are presented, the devices described will be planar and ranging from DDC devices to legacy planar devices. The embodiments can be used in the context of the same type of devices, however. It shall be further understood that the embodiments presented herein are extendable and can be used in a wider range of device types including DDC, SDC, legacy, JFET, planar bipolar, and three-dimensional gate structures.

Figure 5:
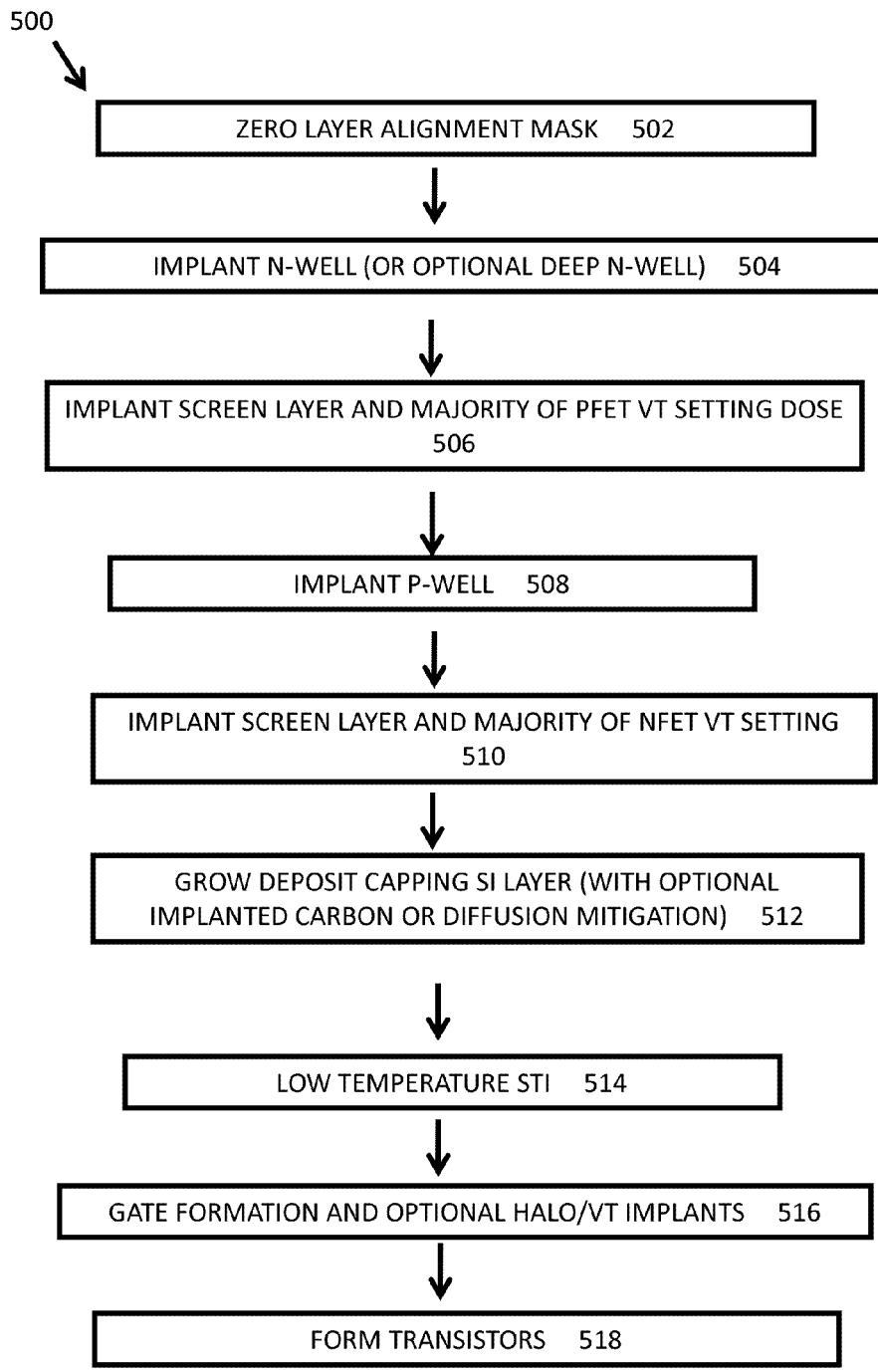
FIG. 5 is an illustration of selected process steps in formation of a blanket epitaxial channel transistor.

To better understand possible processing variations for the present technology, another embodiment of a portion of a transistor manufacturing process is illustrated by FIG. 5. FIG. 5 is a flowchart of steps in an exemplary method 500 for manufacturing transistors. Method 500 begins with step 502 in which a wafer is masked with a "zero layer" alignment mask. This can be performed via a series of masking, photolithography, and etch processes. Thereafter, at step 504, an N-well can be formed. Optionally, this step can also include forming a deep N-well in combination with a conventional N-well. After the N-wells are formed at step 504, a highly doped screen layer and/or Vt set implant for devices in the N-wells can be performed at step 506. These implants can be performed using the same or different dopant species. Optionally, dopant species with increased or decreased silicon diffusivity can be selected. Thereafter at step 508, the N-well is masked and the P-well is implanted. After the P-wells are formed at step 508, a highly doped screen layer and/or Vt set implant for devices in the P-wells can be performed at step 510. These implants can be performed using the same or different dopant species. Optionally, dopant species with increased or decreased silicon diffusivity can be selected. Optionally, other well implants such as an APT implant can also be formed in the respective P and N-wells, before or after the respective screen layer implantations at steps 506 and 510. Each of the foregoing steps can be performed by a combination of masking, photolithography, and/or etch steps, followed by implantation steps and subsequent cleaning steps. Additional steps not described here can also be performed to provide the implants listed above in appropriate regions.

Next, at step 512, a capping silicon blanket epi is deposited or grown across the entire substrate to a preselected thickness. The preselected thickness can be such that it enables a degree of planarizing down from the top surface during subsequent processes (as needed, preferably using chemical mechanical polish) and provides a sufficient maximum silicon channel thickness for selected devices to be DDC devices. Typically the blanket epi is silicon, but silicon germanium or other non-silicon in-situ deposited atoms can also be added to the epitaxial layer either across the substrate or at a preselected device location using masks.

At step 512 or prior to, an optional carbon or other migration stop layer can be formed. In some embodiments, carbon can be implanted into the surface region of the doped wells prior to forming the blanket epi. In other embodiments, carbon or other diffusion inhibiting species can be incorporated into the blanket epi. In either case, the presence of carbon or other diffusion inhibiting species between the doped wells and the blanket epi inhibits the diffusion upward of the implanted species in subsequent steps. For example, carbon or other diffusion blocking species can be provided when a LT STI process is not possible or available.

Following the formation of the blanket epi at step 512, the LT STI process can be performed at step 514. As noted above, this involves forming trenches as isolation structures between devices or wells via patterning and etching. Thereafter, the trenches are filled with electrically insulating materials. In some embodiments, an optional temperature cycling may then be performed before, after, or during the STI process to cause the screen layer dopants in certain devices to migrate selected distances upward into the silicon channel. The distance upward can be determined by the temperature and time of the thermal cycling, as well as the extent of diffusion inhibiting or diffusion enhancing materials contained in the devices.

Gate structures, spacers, contacts, stress implants, tensile films, dielectric coatings, and the like are then formed, resulting in operable transistors. For example, at step 516, gate structures can be formed. The formation of these gate structures can be preceded or followed by processes to complete the legacy transistors. For example, additional channel doping can be done at step 516 using halo implants after formation of the gate structures and/or traditional channel implants before the gate structure is formed. Finally any additional steps for completing the transistors and the die can be performed at step 518, such as spacers, metallization, etc.

As noted above, the aforementioned methods of manufacture are particularly advantageous for DDC devices. Various advantages and possible process variations for forming DDC devices are discussed in U.S. Pat. No. 8,273,617, entitled "Electronic Devices and Systems, and Methods for Making and Using the Same", U.S. patent application Ser. No. 12/971,884, entitled "Low Power Semiconductor Transistor Structure and Method of Fabrication Thereof", and U.S. patent application Ser. No. 12/971,955, entitled "Transistor with Threshold Voltage Set Notch and Method of Fabrication Thereof", all of which are herein incorporated by reference in their entirety.

Figure 6:
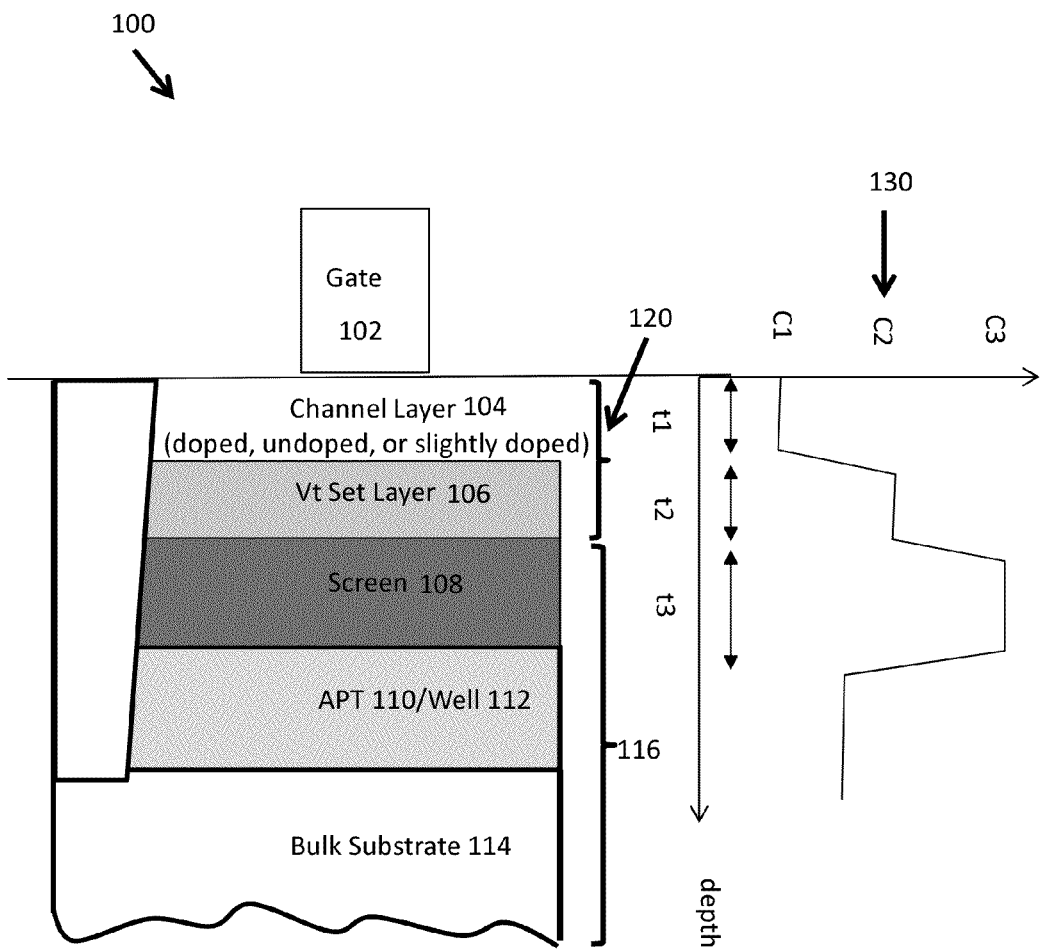
FIG. 6 illustrates a schematic of a deeply depleted channel (DDC) device and doping concentrations therein.

One example of a DDC device that can be manufactured with LT STI and low temperature anneals according to the present technology is illustrated in FIG. 6. A DDC transistor includes a gate, source, and drain that together define a channel. In operation, the channel is deeply depleted, forming what can be described as deeply depleted channel with depletion depth under the gate set by a highly doped screening layer. As noted, while the channel is substantially undoped, the epitaxial layer may include simple or complex layering with different dopant concentrations. This doped layering can optionally include a distinct threshold voltage set layer with a dopant concentration less than that of the screening layer, positioned between the gate and the screening layer. A threshold voltage set layer permits small adjustments in operational threshold voltage of the DDC transistor and can be formed by out diffusion from the screen layer, in-situ or delta doping during epitaxial growth, with tightly controlled implants onto the screening layer prior to the epitaxial layer formation, or through the epitaxial layer using a dose and energy selected to result in a threshold voltage set layer embedded a pre-defined distance below the gate. In particular, that portion of the channel adjacent to the gate should remain undoped. Now turning to FIG. 6, there is shown, an exemplary DDC transistor 100 including STI regions 101 and a gate 102, which can be made of any preselected gate material such as polysilicon or a metal gate and an epitaxially grown layer (indicated by bracket label 120) that can support multiple doped layers having substantially different dopant concentrations (with channel layer 104 and an optional threshold voltage set layer 106 being shown). All layers are supported on substrate portion 116 built in bulk silicon 114, such as a silicon substrate. In substrate portion 116, a screen layer 108 is defined, at the surface of substrate portion 116, having a dopant density greater than any layers in epitaxially grown layer 120. Optionally, APT 110 or well/deep well layers 112 are also defined in substrate 116 below the screen layer 108. Vt set layer 106 is directly above screen layer 108. Relative dopant concentration between the gate 102 and the bulk substrate region 114 are indicated by adjacent graph 130, which shows the successively decreasing dopant concentration above and below the screen layer 108 to form a stepped, notched profile.

In device 100, the threshold voltage of transistor 100 can be set, at least in part, by appropriate selection of the thickness of epitaxial layer 120, as well as the positioning, concentrations and thicknesses of one or more dopant layers of varying dopant concentration into the epitaxial layer 120, the presence or absence of lightly doped drains extending into the channel (not shown), or material selection of the metal gate. Implanted dopants can include conventional P or N type dopants in varying concentrations and with varying silicon diffusivity, counter-dopants, or atoms/techniques selected to modify silicon crystal structure or act as dopant diffusion inhibiting (e.g. carbon) or enhancement agents/mechanisms (rapid thermal transient enhanced diffusion, crystal structure changes, silicidation).

In certain embodiments, a single blanket epitaxial layer 120 is formed having a constant thickness and used across the wafer to 1) extend across multiple device types, 2) to extend across multiple blocks of differing device types on a die, 3) to extend across the entire die, or 4) to extend across the entire wafer without making any adjustments to the thickness of the deposited epitaxial layer. To assure best epitaxial layer thickness consistency, a blanket epitaxial layer across the entire wafer or at least across significant portions of die on a wafer is preferred. If local thickness changes to the epitaxial layer are required, then such adjustments can be made by selective etching and/or selective epitaxial growth (e.g. to form, for example, raised source/drains). However, the distance between the gate and the screen can also be specifically varied by controlled diffusion of pre-implanted dopants, so that the effective thickness of the epitaxial layer for a given transistor channel can be modulated. Additionally, channel or halo dopant implants can be used with or without a pre-existing screen to achieve a preselected device type with selected operating characteristics such as threshold voltage.

In certain embodiments, the screening layer 108 is doped to have a concentration between about $5 \times 10^{18}$ dopant atoms per $cm^3$ and about $1 \times 10^{20}$ dopant atoms per $cm^3$, significantly more than the dopant concentration of the undoped channel layer 104. The channel layer 104 can have a dopant concentration on the order of $1 \times 10^{17}$ dopant atoms per $cm^3$, and at least slightly less than the dopant concentration of the optional voltage threshold set layer 106. In the various embodiments, the exact dopant concentrations and screening layer depths can be selected to achieve or improve desired operating characteristics, or to take into account available transistor manufacturing processes and process conditions. In any event, the screening layer thickness and dopant concentration and distance from the gate are defined to form a reservoir of dopants to screen the well from the channel and define the depletion depth when a voltage is applied to the gate, while at the same time minimizing the junction leakage.

As shown in FIG. 6, APT layer 110 can optionally be formed beneath the screening layer 108 to further help control leakage. Typically, an APT layer is formed by direct implant into a lightly doped well, but such a layer can also be formed by out diffusion from the screening layer, via in-situ growth, or other known processes. The APT layer has a dopant concentration less than the screening layer, typically set between about $1 \times 10^{18}$ dopant atoms per $cm^3$ and about $1 \times 10^{19}$ dopant atoms per $cm^3$. In addition, the APT layer dopant concentration is set higher than the overall dopant concentration of the well substrate. In the various embodiments, the exact dopant concentrations and depths can be modified to improve desired operating characteristics of the transistor, or to take in to account available transistor manufacturing processes and process conditions.

As described above, the threshold voltage set layer 106 is positioned above the screening layer 108 and preferably extending across and contacting the screening layer 108. Typically, such a layer is formed as a thin, doped layer. In certain embodiments, delta doping, controlled in-situ deposition, or atomic layer deposition can be used to form a plane of dopants that is substantially parallel and vertically offset with respect to the screening layer. Alternatively, the threshold voltage set layer 106 can be accomplished by way of controlled diffusion of screen dopant material upward a distance into the channel layer 104 to a preselected depth below the gate 102. Suitably varying dopant concentration, thickness, and separation from the gate 102 and the screening layer 108 allows for controlled and fine adjustments of threshold voltage in the operating transistor. In some embodiments, a positioning the screening layer 108 so that it abuts the source and drain and is above the bottom of the source and drain but below the LDD helps to simultaneously enable a stable threshold voltage while controlling junction leakage and other metrics. In certain embodiments, the threshold voltage set layer is doped to have a concentration between about $1 \times 10^{18}$ dopant atoms per $cm^3$ and about $1 \times 10^{19}$ dopant atoms per $cm^3$. The threshold voltage set layer can be formed by several different processes, including 1) in-situ epitaxial doping, 2) epitaxial growth of a thin layer of silicon followed by a tightly controlled dopant implant (e.g. delta doping), 3) epitaxial growth of a thin layer of silicon followed by dopant diffusion of atoms from the screening layer, 4) deep screen implants coupled with shallow surface doping by plasma doping or other suitable technique, followed by epitaxial growth, 5) by any combination of these processes (e.g. epitaxial growth of silicon followed by both dopant implant and diffusion from the screening layer).

The channel contacts and extends between the source and the drain, and supports movement of mobile charge carriers between the source and the drain. Channel thickness in the undoped portion can typically range from 5 to 50 nanometers, with exact thickness being dependent on desired transistor operating characteristics and transistor design node. For example, a 20 nm gate length transistor will typically have a thinner channel thickness than a 45 nm gate length transistor. In certain embodiments, dopant migration resistant layers of carbon, germanium, or the like can be applied along with or above the screen layer to further limit dopant migration.

In some embodiments, it may be desirable to use transistors having more legacy or standard transistor-characteristics instead of DDC in certain portions of SoCs. However, desired Vt control with mobility, DIBL and drive current and other effects more characteristic of DDC would be sacrificed. A reasonable alternative in some embodiments, then, is to use SDC transistors. SDC transistors can be designed for higher Vt settings compared to DDC devices, and can provide improved functionality over legacy or standard devices.

SDC transistors typically use a screen layer and epitaxial layer as a starting point, as in the case of DDC. However, an SDC transistor is distinct from a DDC transistor in that implants, in-situ epitaxial growth, deliberate screen layer out-diffusion, or other dopant positioning method is used to purposely place a significant amount of dopants in the epitaxial layer but not to such levels as would be the case for legacy or standard transistors. With SDC transistors, most, if not all, of the channel layer 104 will be doped to a certain extent, in contrast to the undoped channel layer of a DDC transistor. The concentration and uniformity of dopants can vary, but the doping concentration for the channel layer 104 will be a concentration between that of the undoped channel layer in DDC transistors and the highly doped channel layer in conventional or legacy transistors. An SDC transistor is distinct from conventional or legacy transistors not only in the dopant concentrations and structure but also in certain fundamental characteristics of the transistor, namely, better Vt control, lower DIBL, and higher drive current. However, as will be appreciated, while mobility in the channel and Vt variations for an SDC transistor are improved relative to a conventional transistor, an SDC transistor will not generally have as high mobility as comparable DDC devices. Further, Vt variations in SDC transistors, locally, globally, or both, will generally not be as low as that observed in a comparable DDC transistors. However, SDC easily integrates with a DDC a process flow.

A doped channel transistor (also known herein as "conventional" or "legacy" transistor) is generally a conventional field effect transistor that is characterized by having dopants in the channel, either by way of halo dopants or channel implants or both, so as to set threshold voltage. Threshold voltage implants, channel dopant implants, and halo implants can all be used in the foregoing process to build legacy transistors while using a low-temperature STI process. Such legacy devices are preferably formed after the low-temperature isolation regions are created, though if a channel implant is used, the channel implant can optionally occur before the STI process or can be done after the STIs are formed. The undoped blanket epi is formed prior to STI. For the conventional transistors, the undoped blanket epi serves as the substrate for the transistor channel. While legacy transistors have significantly inferior mobility, reduced drive current and increased DIBL and increased noise as compared to DDC or SDC transistors, die that incorporate legacy transistors into pre-ordained areas can be practical for avoiding additional work to port circuit blocks. In additional to a doped channel transistor, embodiments herein contemplate forming other types of devices, for instance, DRAM, flash memory, analog and other devices that may traditionally include the use of high temperature processes, together with DDC and/or SDC devices.

Figure 7:
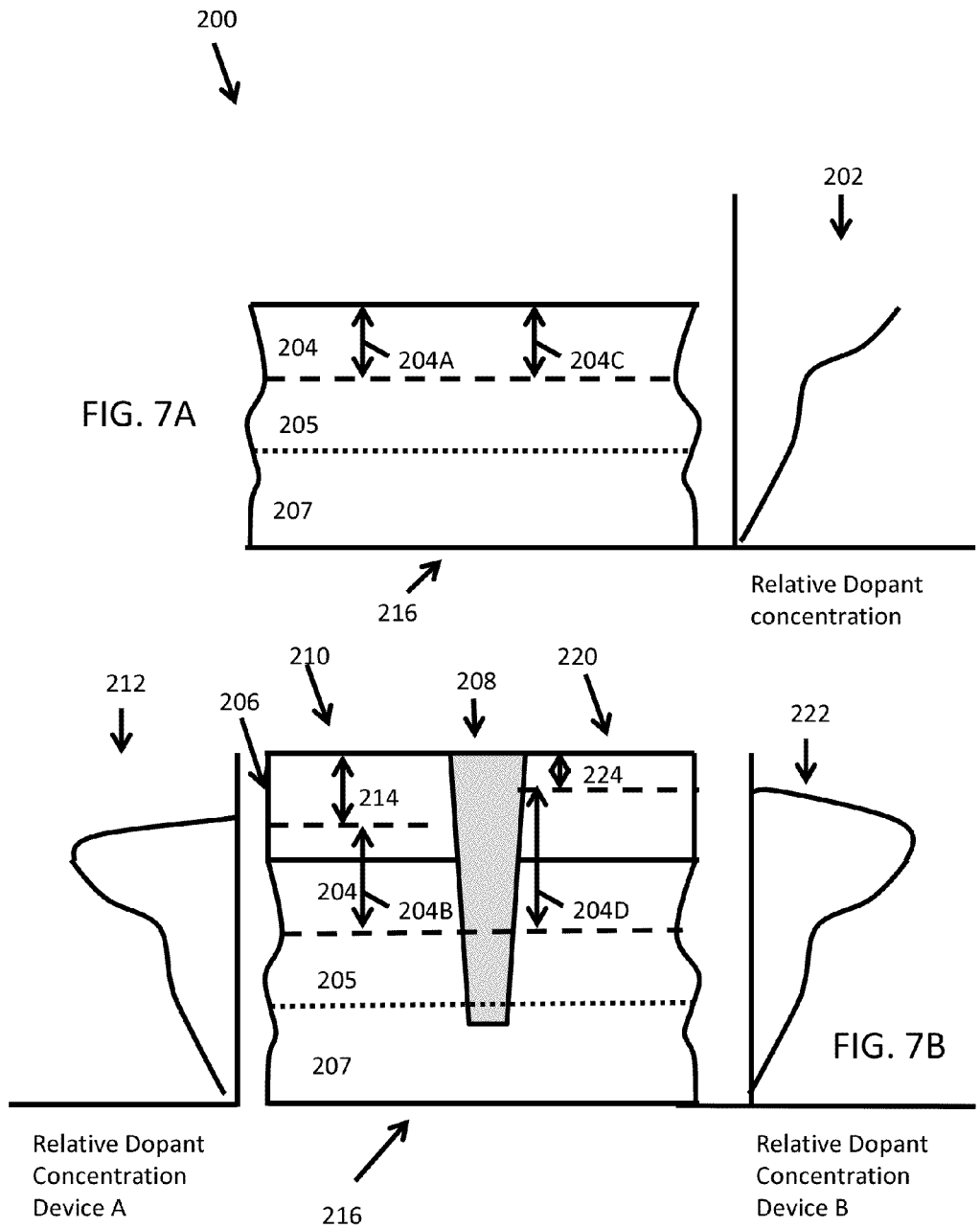
FIGS. 7A and 7B schematically illustrate selected structures of an SoC with at least two distinct device types separated by an isolation structure, and having separate Vt settings achieved by varied screen layer thickness and depth.

FIGS. 7A and 7B schematically illustrate selected structures, processing steps, and an exemplary resulting dopant profile in a SoC 200 during manufacture. In particular, FIGS. 7A and 7B show exemplary structures and processing steps prior to STI and after STI, respectively.

As seen in FIG. 7A, the devices are constructed on a common substrate 216. The substrate 216 can be implanted with dopants to provide an initial dopant profile 202. The dopant profile 202 roughly defines layers that will result post-processing in at least three distinct layers, including the screen layer 204, APT layer 205, and well 207, all supported on substrate 216. The dopant concentration typically peaks at or near the surface of substrate 216 in the screen layer 204. For those devices where screen layer 204 should not be allowed to migrate upward, an optional capping layer made of carbon or other diffusion inhibiting material can be doped on top of or within the screen layer 204.

As seen in FIG. 7A, a blanket epi layer 206 is subsequently grown on substrate 216. The blanket epi layer 206 can be intrinsic silicon, silicon germanium, or other channel material. Thereafter, an STI process can be applied to form STI regions 208 and can be used to define at least two distinct device types 210 and 220 separated by STI regions 208, as shown in FIG. 7B. Note that although not shown, a Vt set layer can be incorporated into device 210 to create a stepped or notched dopant profile. Further tuning of Vt can be achieved as desired by varying screen layer thickness and depth, by way of a separately defined implantation step or a combination of both, preferably before formation of blanket epi layer 206 but fine adjustments to Vt can be made after epi layer 206 is formed.

Before or after forming of STI regions 208, portions of the blanket epi layer 206 that will respectively form different devices types 210 and 220 in FIG. 7B can be differentially treated with constant or graded profile carbon or other diffusion inhibiting or diffusion enhancing implants. The thermal cycles (including optional rapid thermal processing) for annealing are specially designed to minimize diffusion of dopants or to achieve preselected migration levels of the dopants for one or more devices to result in channel doping characteristics specific to the devices. To further control the degree of diffusion, a low temperature STI recipe should be used. The thermal or annealing cycles can also be selected to minimize dopant migration, though in certain processing cases if desired, the thermal or annealing cycles can serve to allow for a controlled diffusion to result in a pre-selected dopant profile in the channel, with some portion of the channel remaining undoped, as specified for the desired device characteristics. The controlled diffusion is achievable because of the differential carbon concentrations for selected devices, so that upward diffusion of the screen and ultimate thickness of the screen layer and resulting channel layers 214 to 224 in FIG. 7B (which will be positioned between the gate and the screen layer in the finished transistor) are different for different devices.

Alternatively or in addition, the process can be implemented to result in device 210 and preferably, STI 208, and then, additional dopant species can be implanted in selected portions of the blanket epi 206 to form device 220. In both alternatives, different dopant profiles 212 and 222 in the transistor channel are achieved. As can be observed, the diffusion of dopants results in the screen layer 204 slightly increasing in thickness (as indicated respectively by the length differential between arrows 204A and 204B) for device 210. In contrast, the screen layer 204 significantly increases in thickness for device 220 (as indicated respectively by the length differential between arrows 204C and 204D). Afterwards, the process proceeds to formation of gate and source/drain structures (not shown) to form the transistor devices 210 and 220.

Applying the same operating conditions to devices 210 and 220 with such variations in thickness of the screen layer 204 will result in device groupings having distinct threshold voltages, despite sharing the same epitaxially grown channel, the same thermal processing/anneal conditions, and having similar gate lengths. However, those devices that are formed to result in DDC or SDC transistors will have noticeably better threshold voltage variation compared to the legacy transistor devices.

Figure 8:
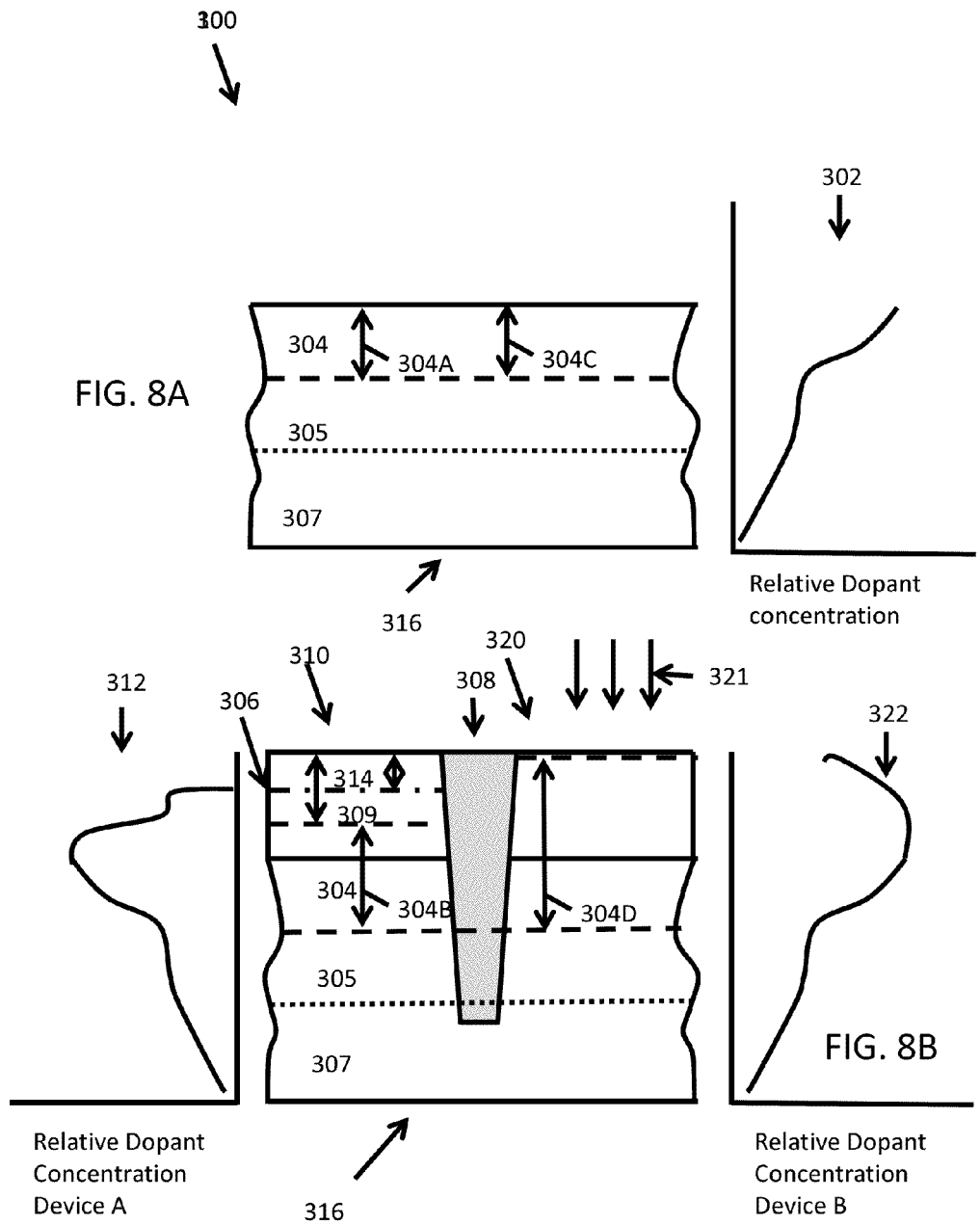
FIGS. 8A and 8B schematically illustrate selected structures of another SoC with at least two distinct device types separated by an isolation structure, and having separate Vt settings achieved by varied screen layer thickness and depth.

As another example, FIGS. 8A and 8B schematically illustrate selected structures, processing steps, and dopant profiles in the manufacture of a SoC 300. Similar to FIGS. 7A and 7B, FIGS. 8A and 8B show the processes, structures, and dopant profiles before and after an STI process, respectively. Specifically, FIGS. 8A and 8B illustrate one configuration for including DDC devices and legacy devices on a same die.

As seen in FIG. 8A, the devices are constructed on a common substrate 316. The substrate 316 can be implanted with dopants to provide an initial dopant profile 302. The dopant profile 302 roughly defines layers that will result post-processing in at least three distinct layers, including the screen layer 304 (with screen thickness 304A), APT layer 305, and well 307, all supported on substrate 316. Alternatively, for the legacy devices, the screen layer 304 can be omitted. The dopant concentration typically peaks at or near the surface of substrate 316 in the screen layer 304, and as will be appreciated, one or more dopants having different diffusivity characteristics can be co-implanted. For those devices where screen layer 304 should not be allowed to migrate upward, an optional capping layer made of carbon or other diffusion inhibiting material can be doped on top of the screen layer 304.

As seen in FIG. 8A, a blanket epi layer 306 is grown on substrate 316. The blanket epi layer 306 can be intrinsic silicon, silicon germanium, or other channel material. Thereafter, an STI process can be applied to more STI regions 308 and can be used to define at least two distinct device types 310 and 320 separated by STI regions 308, as shown in FIG. 8B For the at least two distinct device types 310 and 320 separated by isolation structure 308, separate Vt settings can be achieved by way of a screen layer concentration and depth from the gate for device 310, and by way of channel or halo dopants or both, for device 320.

As seen in FIGS. 8A and 8B, an STI process is performed such that the STI extends through blanket epi layer 306, screen layer 304, APT layer 305, and at least a portion of well 307 to define STI regions 308. Note that the epitaxial layer 306 can be intrinsic silicon, silicon germanium, or other channel material. The STI can be formed using, for example, a low temperature or high temperature process including a combination of trench etch, liner formation and dielectric fill. Further, before or after STI regions 308 are formed, portions of the epitaxial layer 306 that respectively form device types 310 and 320 can be differentially treated with constant or graded profile carbon or other diffusion inhibiting or enhancing implants.

For the exemplary device 310, a carbon migration stop layer at a sufficient concentration can be used such that the upward diffusion of the screen and ultimate thickness of the screen layer and channel layer 314 for device can be defined. For example, as shown in FIG. 8B, an intermediate threshold set layer 309 can be defined having an intermediate dopant concentration between the doping concentration of the channel 314 and screen 304 (with screen 304 being somewhat expanded into the epitaxial layer 306) by either implant of dopants onto screen 304 or by diffusion during thermal cycling to result in a doped layer having a thickness 304B.

Thermal cycling is then carried out so that dopants 304D diffuse upward to form at least the foundation for a legacy transistor channel. The wafer can then be masked to protect that portion of the substrate having devices 310-, and additional dopant species can be implanted 321 solely in the portion of the substrate that to form device 320. In addition, direct channel or halo implants 321 (after formation of the gate) can be used to dope the channel of device 320.

In effect, the differences between effective diffusivity and implant conditions can result in different dopant profiles and are respectively illustrated as profile 312 and 322, with the screen layer 304 (if present) moderately increasing in thickness for device 310, and additionally forming an intermediate threshold voltage set layer 309. In contrast, the thickness of screen layer 304 greatly increases in thickness (as shown by the difference between 304C and 304D) for device 320 to substantially eliminate the previously undoped regions in blanket epi layer 306. Effectively, this forms a transistor having operation properties similar to a traditional channel doped legacy transistor.

After formation of gate and source/drain structures to form the transistor devices (not shown) and applying the same operating conditions, the device 320 will have a significantly different higher threshold voltage (high Vt) as compared to device 310 (regular Vt) because of the differing screen and channel dopant conditions, even while otherwise sharing the same thermal processing/anneal conditions, doping conditions, and having similar dimensions.

To better understand design selection parameters, required transistor structures, and suitable processes for manufacture of transistors having differing threshold voltages, the following Table, Figures, and Examples are provided. In the following table, a range of suitable materials, operating parameters, and the like are described for commonly required transistor device types that can be constructed according the present disclosure. In Table 2, C1, C2, and C3 refer to ranges of layer concentrations for the respective channel, voltage threshold set layer, and screen layer as indicated in FIGS. 1, t1, t2, and t3 respectively refer to thickness of the channel, voltage threshold set layer, and screen layer, and LVT, RVT and HVT respectively refer to a low Vt, a regular Vt, and a high Vt device.

TABLE 2

Target Parameters and Processing Conditions for Different Transistor types.

|  | LVT | RVT | HVT | SRAM |
|---|---|---|---|---|
| VT range | [0.2 V-0.4 V] | [0.3-0.5 V] | [0.4-0.6 V] | [0.4-0.6 V] |
| Target doping profile | t1 [10-15 nm] t2 [0-5 nm] C1 [0-1e17] C2 [1e17-1e18] C3 [1e18-1e19] | t1 [5-10 nm] t2 [5-10 nm] C1 [0-1e17] C2 [1e17-1e18] C3 [1e18-1e19] | t1 [0-5 nm] t2 [10-15 nm] C1 [0-1e17] C2 [1e17-1e18] C3 [1e18-1e19] | t1 [10-15 nm] t2 [0-5 nm] C1 [0-1e17] C2 [1e17-1e18] C3 [1e18-1e19] |
| Gate Stack | nMOS: N, pMOS: P | nMOS: N, pMOS: P | nMOS: N, pMOS: P | PMOS/NMOS metal swap |
| Carbon in screen (nMOS) | Energy [1-5 keV] Dose [3e14-2e15] | Energy [1-5 keV] Dose [0-3e14] | Preferably no C | Energy [1-5 keV] Dose [3e14-2e15] |
| Screen dopant species | nMOS: B, BF2, In pMOS: Sb | nMOS: B, BF2 pMOS: Sb or As | nMOS: B, BF2 pMOS: As | nMOS: B, BF2, In pMOS: Sb |
| Epitaxy | Undoped or C-doped | Undoped | Undoped | Undoped, or C-doped |
| Additional Halo implantation | Preferably 0 | dose: [5e12-2e13] | Dose: [1e13-4e13] | Preferably 0 |
| Channel material | Si or SiGe channel (pMOS) | Si or SiGe channel (pMOS) | Si or SiGe channel (pMOS) | Si |

Figure 9:
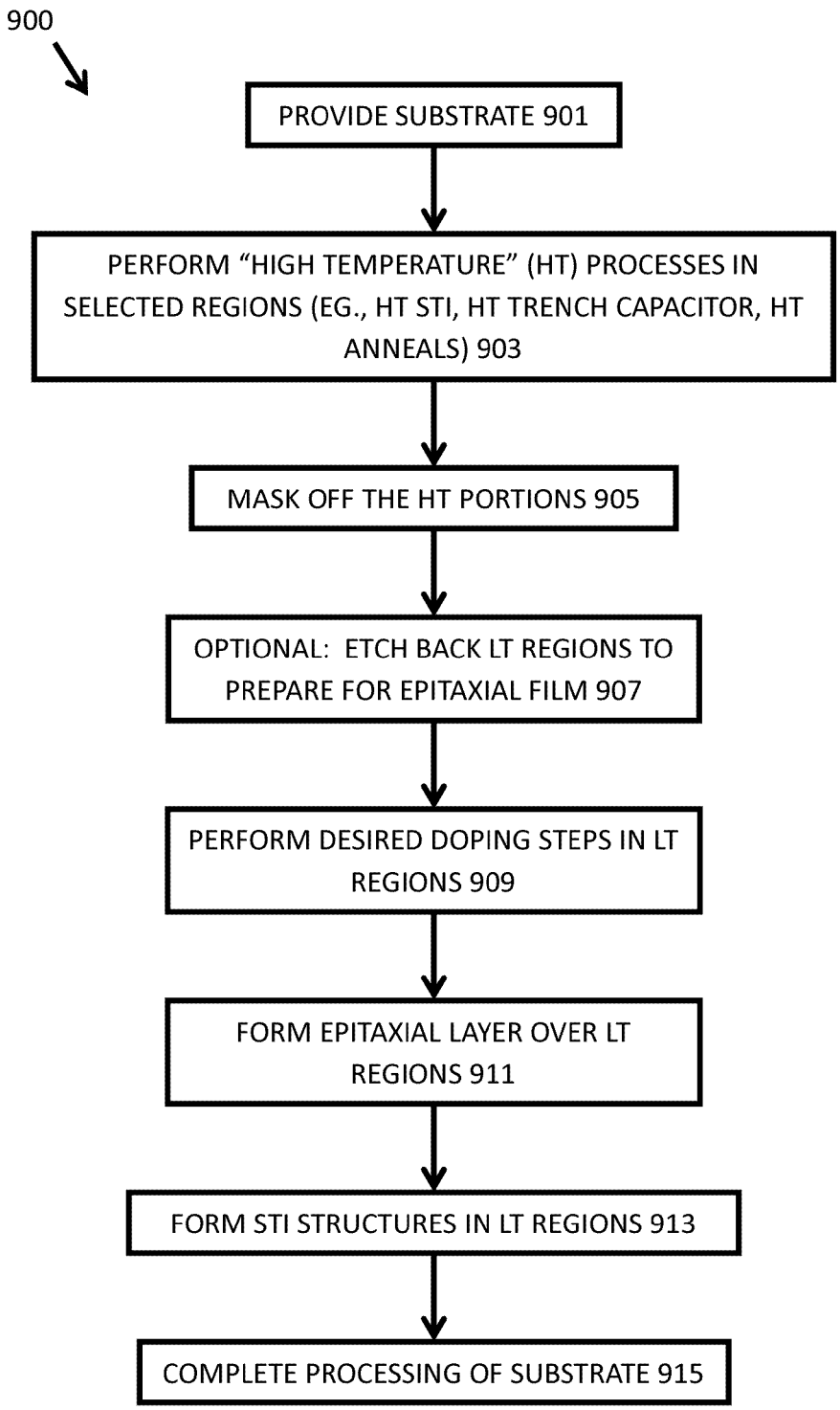
FIG. 9 is an illustration of selected process steps in formation of a blanket epitaxial channel transistor in accordance with an alternate embodiment.

An alternative embodiment to afore-described hybrid STI-first, STI-last flow is provided by the flow 900 in FIG. 9. The flow starts with a substrate 901. On the substrate, "high temperature" (HT) processes are performed only in selected regions 903. For instance, if the selected regions include forming legacy devices, the HT steps may be HT STI. In other instances, the HT steps may be relating to forming portions of a DRAM cell or flash memory block. When the HT structural portions are complete, the HT regions are blocked off with a mask 905. Then, optionally, the LT regions can be etched back 907 in anticipation of a to-be-formed epitaxial film. The etchback can be minimal, simply to prepare the substrate to cleanly form the epitaxial film, or the etch-back can be more pronounced, in other words, etched sufficiently deeply so that when the epitaxial film is formed, the top surface can be more easily made planar. At step 909, the desired doping is performed. For instance, for NMOS DDC, there may be ion implantation of boron-species together with a carbon buffer layer created using a germanium pre-amorphization. For PMOS DDC, there may be ion implantation of antimony-species. To further prevent dopants from moving, particularly in the NMOS DDC regions, the ion implantation may be preceded with a thin layer of in-situ boron doped epitaxial silicon which may be formed selectively to the PMOS regions or formed on both the NMOS and PMOS regions with subsequent counterdoping to be done in the PMOS regions with extra arsenic or antimony or both. Instead of or in addition to DDC dopant profiles, SDC doping may be performed—for instance, using a more mobile dopant species in addition to the screen layer. After the DDC/SDC dopants have been emplaced, a film, preferably epitaxial silicon, is then formed in the LT regions 911, while keeping the HT regions sufficiently masked. Note that while epitaxial silicon is the preferred film, other films may be formed so as to serve as a substrate for the LT device, for instance, III/V semiconductors. During the LT process steps, care is taken to keep within a pre-selected thermal budget. The thermal budget is driven by the need to create and maintain the desired dopant profile for the DDC/SDC devices. The thermal budget may be higher, for instance, if DDC is used for PMOS only and SDC is used for NMOS. Or, with sufficient carbon or other migration stop techniques, a higher thermal budget may be used. After the epitaxial layer is formed, STI structures are created 913. Note that STI structures may be created in the LT regions only, or, if STI structures are desired in other parts of the die, the HT mask may be removed and LT STI may be formed in the other selected regions. Note further that other isolation structures alternative to shallow-trench style may also be used. Following formation of the isolation structures 913, the substrate processing can be completed by way of the other steps 915, for instance, formation of gate structures, source and drain, etc. While the flow of FIG. 9 involves using extra masks because of the formation of the high-temperature structures followed by formation of the low-temperature structures, the flow provides a flexibility around integrating low temperature processes when the high-temperature processes are to remain in place. The flow is useful for integrating DDC structures into an otherwise high-temperature process flow. However, the flow can be used in other device contexts beyond or alternative to DDC, where some devices should be formed using reduced temperatures while other devices should be formed at higher temperatures.

Figure 10:
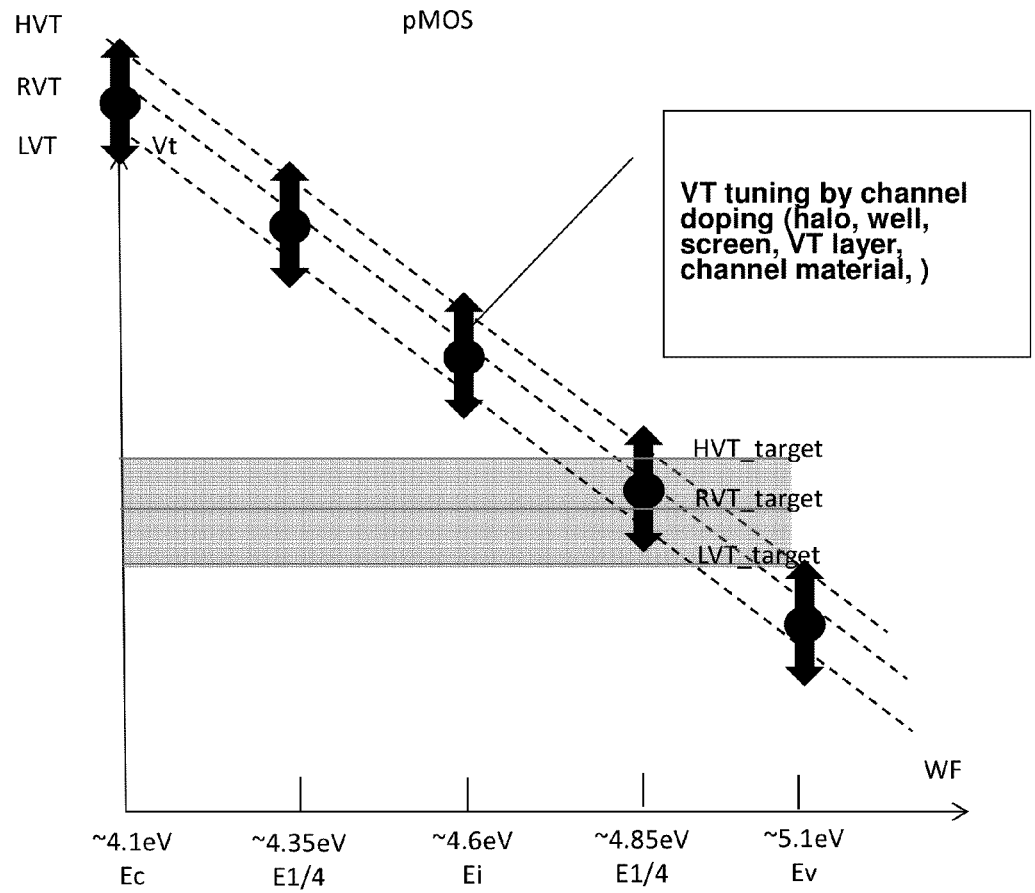
FIG. 10 shows a plot illustrating how gate work function selection can also be used in conjunction with varying channel/screen/threshold voltage set layer dopant concentration to adjust threshold voltage.

Now turning to FIG. 10, there is shown a plot demonstrating how gate work function selection can also be used in conjunction with varying channel/screen/threshold voltage set layer dopant concentration to adjust threshold voltage of various devices. Gate work function selection is particularly implementable using certain metal gate materials. For instance, TiN having a mid-gap work function of approximately 4.6 eV can be used as the metal material. The TiN work function can be adjusted as desired by selective nitridation or other means, thereby allowing for still another set point against which the transistor devices can be targeted using changes in screening layer concentrations, screen layer thickness and/or channel thickness. In FIG. 10, a PMOS device can require a certain metal selection, determinable by matching the desired work function to a desired Vt. This same metal can be used in at least some other device types by varying channel thickness, material, changing concentration and thickness of screen and/or threshold voltage layers, providing a design selection spread that can encompass, for example, a high Vt and a regular Vt device. This technique, known herein and in the Figures as a metal mid-gap reuse, allows for use of the same mask/metal in two or more devices, simplifying and speeding manufacture. A variation on this technique is metal swap, where the metal type which may or may not be a mid-gap work-function metal for a given NMOS and PMOS pair is swapped for the next NMOS and PMOS pair, with as much re-use of previously used metal material as possible. While metal mid-gap reuse techniques can allow for various threshold voltage settings for given device types with substantially the same metal type requirements, even greater Vt setting flexibility is possible when used in conjunction with well implant adjustments. For example, a SoC with SRAM transistors in the bit cell can have well dopants implanted before shallow trench isolation (STI). The screening layer is implanted before shallow trench isolation and a low doped or undoped epitaxial silicon layer is grown on top of the screen layer. A threshold voltage setting region is achieved by diffusion from the screen layer or by way of a pre-selected implant recipe performed before or after the epitaxial layer is grown. Then, the STI module is performed using a low-temperature liner. Following STI, if legacy devices are desired, then halo implants can be performed after gate formation into the undoped epitaxial layer to create a legacy device. Using low temperature processing, the channel under the gate may remain undoped, be slightly doped, or be heavily doped depending on the device operational specifications. In certain embodiments, a separate Vt set layer below an undoped channel may be provided by in-situ dopant implantation during growth, or selective diffusion of high diffusivity dopants from the screen.

Transistors created according to the foregoing embodiments, structures, and processes can be formed on the die alone or in combination with other transistor types. Certain of the transistors formed according to the disclosed structures and processes, namely, embodiments of DDC and SDC transistors, can have a reduced mismatch arising from scattered or random dopant variations as compared to conventional MOS analog or digital transistors. The ability to combine DDC and SDC transistors with other devices and cell structures is particularly important for allowing for improved circuit performance on certain die regions, for instance, SRAM, while sustaining cell structures in other areas, for instance, legacy devices to support legacy circuitry, or DRAM or flash memory or other blocks.

While various embodiments of the present technology have been described above, it should be understood that they have been presented by way of example only, and not limitation. Numerous changes to the disclosed embodiments can be made in accordance with the disclosure herein without departing from the spirit or scope of the invention. Thus, the breadth and scope of the present technology should not be limited by any of the above-described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A method of manufacture of an integrated circuit, comprising the steps of:
   providing a substrate;
   fabricating at least a portion of first integrated structures in at least one first area of the substrate using a first process that includes forming at least one of a trench capacitor, at least a part of a flash memory cell structure, or a first shallow trench isolation structure;
   fabricating at least a portion of second integrated structures in at least one second area of the substrate, the fabricating of the portion of the second integrated structures comprising defining at least a first targeted dopant profile in the at least one second area and forming an epitaxial layer on the at least one second area, the first target dopant profile comprising a first section with a first doping concentration at a surface of the at least one second area defining a heavily doped screening layer and a second section below the first section with a second doping concentration less than the first doping concentration defining a well layer, wherein the fabrication of the portion of the second integrated structures includes using a second process that is at a reduced thermal budget compared with the first process; and
   completing the first and second integrated structures to form the integrated circuit.

2. The method of claim 1, wherein the step of fabricating the portion of second integrated structures further comprises forming isolation structures in the epitaxial layer.

3. The method of claim 2, wherein the step of fabricating the portion of second integrated structures further includes the step of etching the at least one second area of the substrate to a preselected depth prior to forming the epitaxial layer.

4. The method of claim 1, wherein the step of fabricating the portion of second integrated structures includes forming doped regions using ion implantation in a process selected to result in the first target dopant profile.

5. The method of claim 4, wherein the step of fabricating a portion of second integrated structures includes etching the at least one second area of the substrate to a preselected depth prior to the forming of the doped regions, and forming an epitaxial layer after the forming of the doped regions.

* * * * *